United States Patent
Lin et al.

(10) Patent No.: US 9,640,475 B1
(45) Date of Patent: May 2, 2017

(54) CHIP PACKAGING STRUCTURE AND MANUFACTURING METHOD THEREOF

(71) Applicant: MStar Semiconductor, Inc., Hsinchu, Hsien (TW)

(72) Inventors: You-Wei Lin, Zhubei (TW); Zhi-Zhong Zhuang, Zhubei (TW); Chih-An Yang, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 15/065,992

(22) Filed: Mar. 10, 2016

(30) Foreign Application Priority Data

Jan. 7, 2016 (TW) .............................. 105100349 A

(51) Int. Cl.

| | |
|---|---|
| H01L 29/00 | (2006.01) |
| H01L 23/498 | (2006.01) |
| H01L 23/00 | (2006.01) |
| H01L 23/31 | (2006.01) |
| H01L 21/56 | (2006.01) |

(52) U.S. Cl.
CPC ........ *H01L 23/49861* (2013.01); *H01L 21/56* (2013.01); *H01L 23/3121* (2013.01); *H01L 23/3142* (2013.01); *H01L 23/3171* (2013.01); *H01L 23/49811* (2013.01); *H01L 23/49838* (2013.01); *H01L 24/06* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 2224/05016* (2013.01); *H01L 2224/0612* (2013.01); *H01L 2224/32155* (2013.01); *H01L 2224/32175* (2013.01); *H01L 2224/4813* (2013.01); *H01L 2224/48227* (2013.01); *H01L 2224/48247* (2013.01); *H01L 2224/73265* (2013.01); *H01L 2224/92247* (2013.01);
(Continued)

(58) Field of Classification Search
CPC ............. H01L 23/642; H01L 23/49816; H01L 23/49838; H01L 23/49827; H01L 23/3128; H01L 23/42; H01L 23/3675; H01L 21/561; H01L 21/565
USPC .......................................... 257/528; 438/107
See application file for complete search history.

(56) References Cited

U.S. PATENT DOCUMENTS

2002/0023342 A1 * 2/2002 Nakamura ............. H05K 3/341
29/832
2007/0161266 A1 * 7/2007 Nishizawa ............. H01L 24/97
439/69

(Continued)

*Primary Examiner* — Trung Q Dang
(74) *Attorney, Agent, or Firm* — Edell, Shapiro & Finnan, LLC

(57) ABSTRACT

A chip packaging structure includes a chip, a passive component, and at least two metal lines. In the chip, first bonding pads, second bonding pads and connecting pads are disposed above an integrated circuit, and the second bonding pads and the connecting pads are separated from the integrated circuit. The second bonding pads are electrically connected to the corresponding connecting pads, respectively. The passive component is disposed on the chip, and includes two electrodes that are respectively electrically connected to and adhered to one of the corresponding connecting pad. The metal lines are disposed on the chip, and have one end thereof respectively connected to the second bonding pads, and the other end respectively connected to the first bonding pads.

24 Claims, 9 Drawing Sheets

(52) U.S. Cl.
CPC *H01L 2924/14* (2013.01); *H01L 2924/19104* (2013.01); *H01L 2924/2064* (2013.01)

(56) References Cited

U.S. PATENT DOCUMENTS

| | | | | |
|---|---|---|---|---|
| 2009/0145636 | A1* | 6/2009 | Miki | H01L 21/6835 174/255 |
| 2011/0304016 | A1* | 12/2011 | Nakamura | H01L 21/4857 257/532 |
| 2012/0020041 | A1* | 1/2012 | Hosokawa | H01L 21/561 361/772 |
| 2013/0134574 | A1* | 5/2013 | Ihara | H01L 23/3675 257/706 |
| 2015/0084051 | A1* | 3/2015 | Kubo | H01L 22/32 257/48 |

* cited by examiner

CHIP PACKAGING STRUCTURE AND MANUFACTURING METHOD THEREOF

This application claims the benefit of Taiwan application Serial No. 105100349, filed Jan. 7, 2016, the subject matter of which is incorporated herein by reference.

BACKGROUND OF THE INVENTION

Field of the Invention

The invention relates in general to a chip packaging structure, and more particularly to a chip packaging structure that disposes a passive component in a chip.

Description of the Related Art

As semiconductor technologies continue to progress, various circuit components included in an integrated circuit can be manufactured within the same chip, in a way that not only the operational efficiency is increased but also the volume of the integrated circuit can be reduced. However, conventionally, passive components in an integrated circuit require a larger volume in order to achieve expected functions. By manufacturing such passive components in a chip, an excessive large part of the volume of the chip may be occupied, leading to increased material costs required for manufacturing the chip as well as issues of inconsistent quality and characteristics of the passive components manufactured in the chip. Thus, current passive components are usually separately manufactured from the chip, and the two are then integrated in the same packaging structure through a packaging process.

In a conventional chip packaging structure, as passive components and a chip are separately disposed on a carrier board, the passive components can only be electrically connected to an integrated circuit through conductive lines and metal lines on the carrier board. In addition, due to fabrication process limitations, a certain gap needs to be kept between the passive components and the chip to prevent collisions between the passive components and the chip during die bonding. As a result, the resistance/capacitance loading effect may be too high, hence causing unsatisfactory operational efficiency of the integrated circuit.

Therefore, there is a need for a chip packaging structure for enhancing the operational efficiency of an integrated circuit.

SUMMARY OF THE INVENTION

It is a primary object of the present invention to provide a chip packaging structure for enhancing the operational efficiency of an integrated circuit.

A chip packaging structure is provided according to an embodiment of the present invention. The chip packaging structure includes a chip, a passive component, and at least two metal lines. The chip includes an integrated circuit, a plurality of first bonding pads, two second bonding pads and two connecting pads. The first bonding pads, the second bonding pads and the connecting pads are disposed on the integrated circuit, and the second bonding pads and the connecting pads are separated from the integrated circuit. The second bonding pads are respectively electrically connected to the corresponding connecting pads. The passive component is disposed on the chip, and includes two electrodes that are respectively electrically connected to one of the corresponding connecting pads. The first metal lines are disposed on the chip. Each of the first metal lines has one end connected to one of the second bonding pads, and the other end connected to one of the first bonding pads.

A manufacturing method of a chip packaging structure is provided according to another embodiment of the present invention. A chip is provided. The chip includes an integrated circuit, a plurality of first bonding pads, two second bonding pads and two connecting pads. The first bonding pads, the second bonding pads and the connecting pads are disposed on the integrated circuit, and the second bonding pads and the connecting pads are separated from the integrated circuit. A chip is mounted on a carrier board. A passive component is mounted on the chip. The passive component includes two electrodes that are respectively electrically connected to and adhered to one of the connecting pads. At least two metal lines are formed on the chip, such that each of the first metal lines has one end connected to one of the second bonding pads, and the other end connected to one of the first bonding pads.

In the chip packaging structure of the present invention, the passive component is disposed at a region right above the integrated circuit, and may be electrically connected to integrated circuit through the first bonding pads, the second bonding pads and the connecting pads formed by the same conductive layer, and the first metal lines. Thus, the chip packaging structure of the embodiment is capable of reducing the resistance/capacitance load effect of the lines, thereby further reducing the power consumption of the integrated circuit and noise and enhancing the operational efficiency and speed of the integrated circuit.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
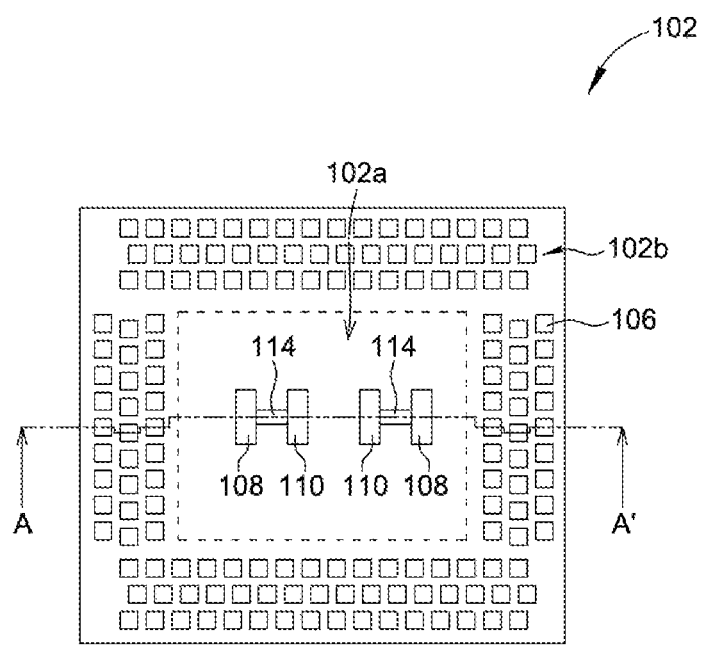
FIG. 1 to FIG. 7 are schematic diagrams of a manufacturing method of a chip packaging structure according to a first embodiment of the present invention.
Figure 2:
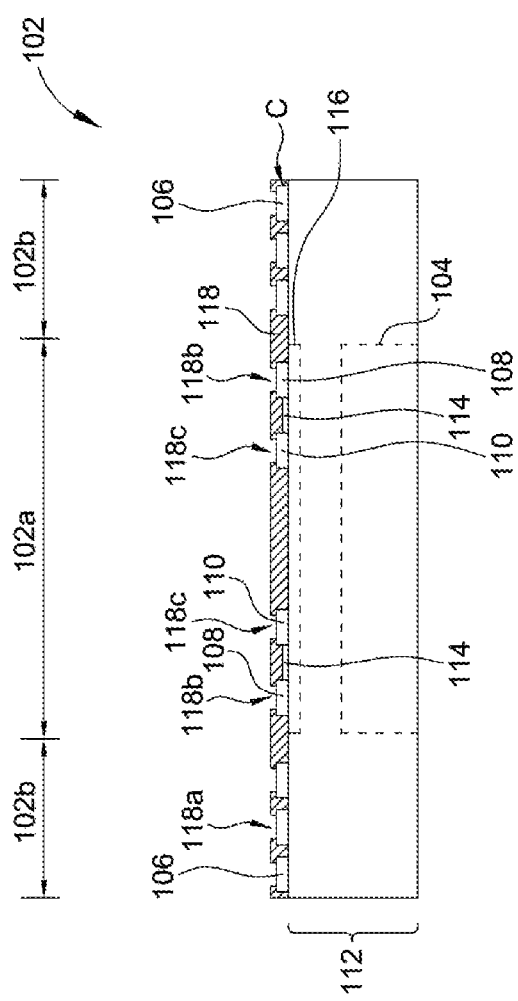
Figure 4:
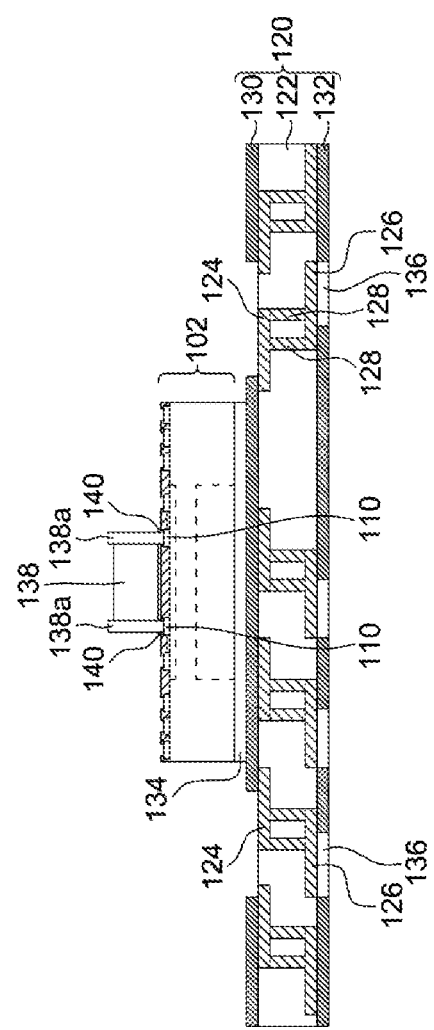
Figure 5:
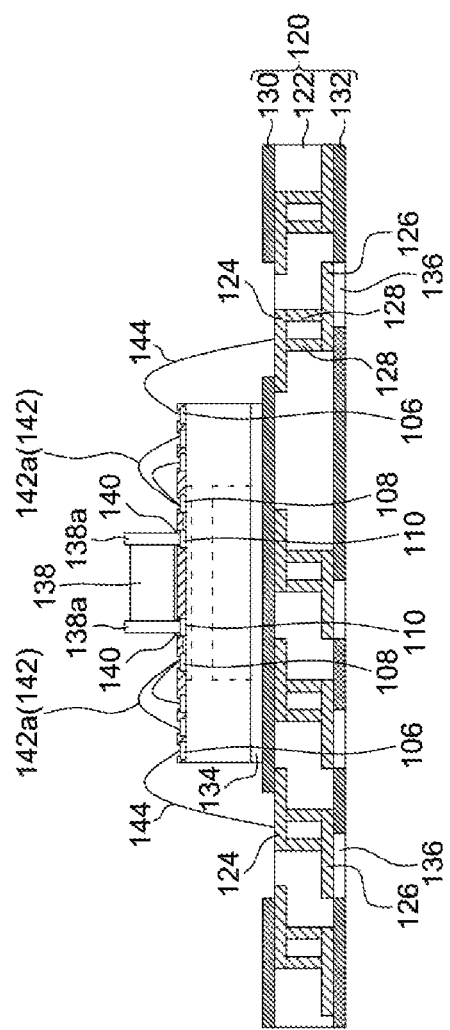
Figure 6:
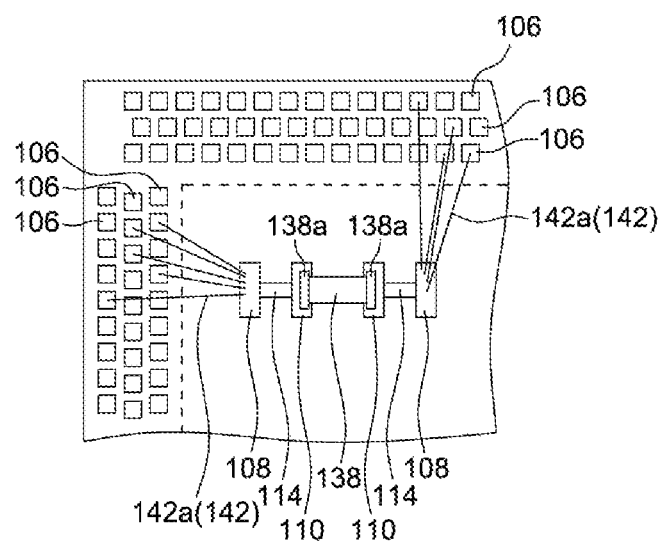
Figure 7:
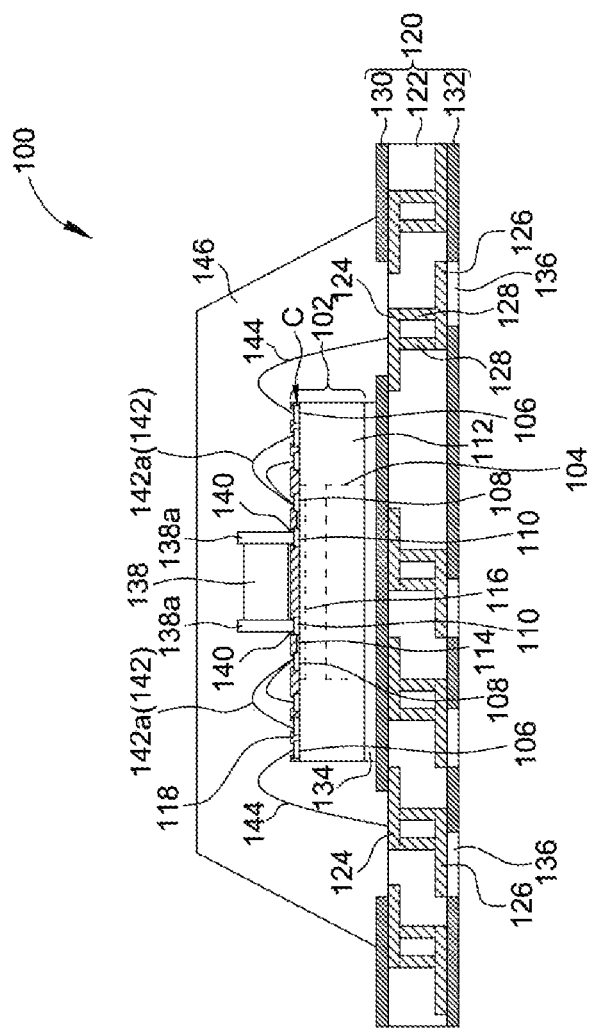

Referring to FIG. 1 to FIG. 7 showing schematic diagrams of a chip packaging structure according to a first embodiment of the present invention. FIG. 1 shows a top view of a chip of the present invention. FIG. 2 shows a sectional view of FIG. 1A along a section line A-A'. FIG. 6 shows a top view of first metal lines formed according to the first embodiment. FIG. 7 shows a sectional view of the chip packaging structure according to the first embodiment. As shown in FIG. 1 and FIG. 2, a chip 102 is first provided. In the embodiment, the chip 102 includes a central region 102a and a border 102b. The border region 102b may be disposed on at least one side of the central region 102a, e.g., the border region 102b may surround the central region 102a. Further, the chip 102 includes an integrated circuit 104, a plurality of first bonding pads 106, at least two second bonding pads 108, and at least two connecting pads 110. The first bonding pads 106, the second bonding pads 108 and the connecting pads 110 are disposed on the integrated circuit 104. The integrated circuit 104, the second bonding pads 108 and the connecting pads 110 are disposed in the central region 102a, and the first bonding pads 106 are disposed in the border region 102b. More specifically, the integrated circuit 104 may be included in an internal circuit structure 112, and may be formed by a plurality of components, e.g., a contact plug (not shown) and a plurality of inner connecting lines (not shown) connected to one another. In practice, the integrated circuit 104 may be designed according to actual requirements. The first bonding pads 106, the second bonding pads 108 and the connecting pads 110 are fabricated on an upper surface of the internal circuit structure 112. Further, the first bonding pads 106 may be electrically connected to the integrated circuit 104 through the inner connecting lines and the contact plug of the internal circuit structure 112, so as to allow the integrated circuit 104 to be further electrically connected to other external components via the first bonding pads 106. In other words, the first bonding pads 106 may be regarded as input/output (I/O) pads of the chip 102. To allow the first bonding pads 106 to be easily electrically connected to other components, the first bonding pads 106 are disposed near sides of the chip 102. More specifically, the first bonding pads 106 are disposed between the second bonding pads 108 and the sides of the chip 102 and between the connecting pads 110 and the sides of the chip 102. Thus, a distance between one of the first bonding pads 106 and the side of the chip 102 is smaller than a distance between one of the second bonding pads 108 and the side of the chip 102 and a distance between one of the connecting pads 110 and the side of the chip 102. In the embodiment, the first bonding pads 106 may be arranged into at least one row along at least one side. For example, the first bonding pads 106 may be arranged along each of the sides of the chip 102 to form at least one row. More specifically, the first bonding pads 106 may be disposed near the four sides of the chip 102, and surround the second bonding pads 108 and the connecting pads 110. Preferably, for example but not limited to, the first bonding pads 106 may be arranged along each of the sides of the chip 102 to form at least three rows. In another embodiment, the first bonding pads 106 may also be arranged along the sides of the chip 102 to form one or two rows. Further, when the first bonding pads 106 are arranged into a plurality of rows, the first bonding pads 106 of two adjacent rows may be staggered. In other words, for example but not limited to, for two adjacent rows, one first bonding pad 106 of one row is located near a space between two first bonding pads 106 of the other row; that is, every three first bonding pads 106 could be arranged in a shape of a Chinese character "品". In another embodiment, the first bonding pads 106 of two adjacent rows may also be aligned, such that the first bonding pads 106 of the two adjacent rows are arranged along a direction perpendicular to an extension direction of each row.

The second bonding pads 108 are electrically connected to the corresponding connecting pad 110, respectively. More specifically, the chip 102 may further include at least two connecting lines 114, which are respectively disposed between the second bonding pads 108 and the corresponding connecting pads 110 to electrically connect the second bonding pads 108 and the corresponding connecting pads 110. In other words, the second bonding pads 110 are electrically connected to the connecting pads 110 via the connecting lines 114 by a one-on-one electrical connection. The quantities of second bonding pads 108, the connecting pads 110 and the connecting lines 114 are not limited to the above exemplary values, and may be determined according to the quantity of passive components to be disposed. For example, for two passive components, the respective quantities of the second bonding pads 108, the connecting pads 110 and the connecting lines 114 may be four, and so forth. Further, the second bonding pads 108 and the connecting pads 110 are separated from the integrated circuit 104 and the first bonding pads 106. Thus, for the chip 102, the second bonding pads 108 and the connecting pads 110 are electrically insulated from the integrated circuit 104 and the first bonding pads 106. More specifically, the second bonding pads 108 and the connecting pads 110 are disposed right above the integrated circuit 104, and the internal circuit structure 112 further includes an insulating layer 116. The insulating layer 116 is disposed between the integrated circuit 104, the second bonding pads 108 and the connecting pads 110, and separates and insulates the integrated circuit 104 from the second bonding pads 108 and the connecting pads 110. For example, the first bonding pads 106, the second bonding pads 108, the connecting pads 110 and the connecting lines 114 may be formed by a same conductive layer C. For example but not limited to, the conductive layer C may be made of a material such as aluminum, gold, palladium and nickel. Further, the insulating layer 116 may be disposed below the conductive layer C, and does not electrically insulate the integrated circuit 104 from the first bonding pads 106. More specifically, the insulating layer 106 covers above the part of the integrated circuit 104 corresponding to the second bonding pads 108, the connecting pads 110 and the connecting lines 114 to electrically insulate the integrated circuit 104 from the second bonding pads 108, the connecting pads 110 and the connecting lines 114, and extends to below the first bonding pads 106. Further, the insulating layer 106 includes openings, such that the first bonding pads 106 may be electrically connected to the integrated circuit 104. Alternatively, the insulating layer 106 may not extend to below the first bonding pads 106. In the embodiment, for example but not limited to, the insulating layer 116 may be in contact with the second bonding pads 108, the connecting pads 110 and the connecting lines 114. In another embodiment, the insulating layer 116 may not come into contact with the second bonding pads 108, the connecting pads 110 and the connecting lines 114. In yet another embodiment, at least two of the first bonding pads 106, the second bonding pads 108, the connecting pads 110 and the connecting lines 114 may be formed by different conductive layers.

In the embodiment, the chip 102 may further include a protecting layer 118 disposed above the integrated circuit 104 and on the connecting lines 114. More specifically, the protecting layer 118 is disposed on an upper surface of the internal circuit structure 112, and extends to above the first bonding pads 106, the second bonding pads 108, the connecting pads 110 and the connecting lines 114. Further, the protecting layer 118 includes a plurality of first openings 118a, at least two second openings 118b and at least two third openings 118c. Each of the first openings 108a reveals one of the corresponding second bonding pads 108, each of the second openings 118b reveals one of the corresponding second bonding pads 108, and each of the third openings 118c reveals one of the corresponding connecting pads 110. For example, the first openings 118a reveal the corresponding first bonding pads 106 according to a one-on-one corresponding relationship, the second openings 118b reveal the corresponding second bonding pas 108 according to a one-on-one corresponding relationship, and the third openings 118c reveal the corresponding connecting pads 110 according to a one-on-one corresponding relationship. Thus, the first bonding pads 106, the second bonding pads 108 and the connecting pads 110 may be connected to metal lines or passive components in subsequent processes. Further, for example but not limited to, the protecting layer 118 of the present invention may cover the connecting lines 114 to protect the connecting lines 114. In another embodiment, the second openings 118b may also be connected to the third openings 118c to reveal the connecting lines 114. Because the second openings 118b and the third openings 118c are for revealing the corresponding second bonding pads and connecting pads, the quantities of the second openings 118b and the third openings 118c are not limited to the above exemplary values. Thus, the quantities of the second openings 118b and the third openings 118c may be determined according to the quantities of the second bonding pads 108 and the connecting pads 110, respectively, and may be equal to the quantities of the second bonding pads 108 and the connecting pads 110.

Figure 3:
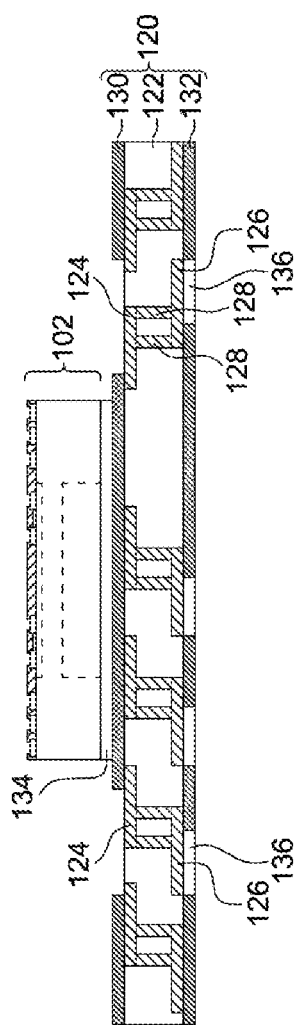

As shown in FIG. 3, the chip 102 is mounted on a carrier board 120. In the embodiment, the carrier board 120 includes a substrate 122, a plurality of upper bonding pads 124 and a plurality of lower bonding pads 126. Preferably but not limited to, the substrate 122 is a hard substrate to more easily dispose the chip 102 on the carrier board 120. The upper bonding pads 124 are disposed on an upper surface of the substrate 122, and the lower bonding pads 126 are disposed on a lower surface of the substrate 122. For example but not limited to, each of the upper bonding pads 124 may be electrically connected to at least one of the lower bonding pads 126. The electrical connection between the upper bonding pads 124 and the lower bonding pads 126 may be modified according to different requirements. For example, the carrier board 120 may further includes a plurality of inner connecting lines 128, an upper protecting layer 130 and a lower protecting layer 132. The inner connecting lines 128 penetrate the substrate 122, and connect the upper bonding pads 124 with the corresponding lower bonding pads 126. The upper protecting layer 130 is disposed on the upper surface of the substrate 122 and the upper bonding pads 124, and includes openings that reveal the upper bonding pads 124 to allow the upper bonding pads 124 to be electrically connected to components disposed on the upper protecting layer 130. The lower protecting layer 132 is disposed on the lower surface of the substrate 122 and the lower bonding pads 126, and includes openings that reveal the lower bonding pads 126 to allow the lower bonding pads 126 to further electrically connect to circuits on a circuit board. In the embodiment, the lower surface of the chip 102 is mounted and adhered to the protecting layer 130 on the carrier board 120 by a die bonding glue 34 through a die bonding process, so as to prevent semiconductor materials at the lower surface of the chip 102 from electrically connecting to the upper bonding pads 124. For example but not limited to, the die bonding blue 34 may include insulating adhesive materials such as epoxy. In the embodiment, the carrier board 120 further includes a plurality of protrusions 136, each of which disposed on one of the lower bonding pads 126 to promote the binding level between solder balls or other conductive materials and the carrier board 120 when the carrier board 120 is soldered onto the circuit board.

As shown in FIG. 4, at least one passive component 138 is mounted on the chip 102. The passive component 138 includes two electrodes 138a, which are electrically connected and adhered to the corresponding connecting pad 110, respectively. In the embodiment, the electrodes 138a of the passive component 138 are mounted on the chip 102 by a conductive adhesive through another die bonding process. For example, two conductive adhesives are disposed on the corresponding connecting pads 110, and the electrodes 138a of the passive component are disposed correspondingly to the connecting pad 110, respectively. The conductive adhesives are dried through a drying process to form two conductive adhesive layers 140, which respectively mount and adhere the electrodes 138a of the passive component 138 onto the chip 102. The present invention is not limited to the above steps. Further, for example but not limited to, the conductive adhesive may be a silver adhesive formed from mixing epoxy and silver powder. Thus, the conductive adhesive layers 140 formed provide not only adhesion but also conductivity, such that the electrodes 138a may be electrically connected to the corresponding connecting pads 110. Further, for example, the passive component 138 may be a resistor, an inductor, a capacitor, or a combination of the above. In one embodiment, the passive component 138 is exclusive used by the chip 102.

As shown in FIG. 5 and FIG. 6, at least two first metal lines 142 are formed on the chip 102, in a way that one end of each of the first metal lines 142 is connected to one of the corresponding second bonding pads 108, and the other end of each of the first metal lines 142 is connected to one of the corresponding first bonding pads 106. More specifically, the step of forming the first metal lines 142 may be performed by a wire bonding process, and so the first metal lines 142 appear as an arc in shape. Each of the two first metal lines 142 has two ends connected to the first bonding pad 106 and the second bonding pad 108 of the chip 102, respectively. Each of the first metal lines 142 includes an intermediate portion 142, which is located between the two ends and is not in contact with the chip 102. In the embodiment, the second bonding pads 108 may be electrically connected to different first bonding pads 106 through a plurality of first metal lines 142. In other words, one end of different first metal lines 142 may be connected to the same second bonding pad 108, while the other end may be connected to different first bonding pads 106. For example, the other end of different first metal lines 142 may be connected to the first bonding pads 106 located at different rows. More specifically, through the first metal lines 142, when there are more than three rows of first bonding pads 106, the second bonding pads 108 of the embodiment may still be electrically connected to the first bonding pads 106 located at the row closest to the side of the chip 102.

It should be noted that, the second bonding pads 108 and the connecting pads 110 of the embodiment are revealed from different second openings 118b and third openings 118c. That is, a part of the protecting layer 118 covers the connecting lines 114 and is located between the second bonding pads 108 and the connecting pads 110. Thus, when the conductive adhesive is disposed on the connecting pads 110, the conductive adhesive does not flow onto the second bonding pads 108, thereby eliminating the issue that one end of the first metal lines 142 cannot be securely adhered on the second bonding pads 108 and hence enhancing the reliability of the first metal lines 142. In the embodiment, the step of forming the first metal lines 142 may further form a plurality of second metal lines 144, in a way that the second metal lines 144 are connected between the upper surface of the carrier board 120 and one of the corresponding first bonding pads 106. More specifically, one end of each of the second metal lines 144 may be connected to one of the upper bonding pads 124 on the upper surface of the substrate 122, and the other end may be connected to one of the first bonding pads 106. Thus, the integrated circuit 104 of the chip 102 may be electrically connected to the lower bonding pads 126 of the carrier board 120 through the second metal lines 144, the upper bonding pads 124 and the inner connecting lines 128 of the carrier board 120. More specifically, as the first metal lines 142 connect the first bonding pads 106 and the second bonding pads 108 located on the same plane, and the second metal lines 144 connect the upper bonding pads 124 and the first bonding pads 106 located on different planes, for example but not limited to, the manufacturing of the second metal lines 144 may preferably closely follow the manufacturing of the first metal lines 142, or the manufacturing of the first metal lines 142 may closely follow the manufacturing of the second metal lines 144. Alternatively, the manufacturing of the first metal lines 142 and the manufacturing of the second metal lines 144 may also be interleavingly performed and completed. Further, for example but not limited to, the first metal lines 142 and the second metal lines 144 may be gold lines, or may be other metal lines suitable for a wire bonding process.

It should be noted that, before the first metal lines 142 are formed, the integrated circuit 104 is electrically insulated from the second bonding pads 108 and is thus electrically insulated from the passive component 138. Through forming the first metal lines 142, the integrated circuit 104 may become electrically connected to the passive component 138 through only the first metal lines 142. Further, since the second bonding pads 108 are disposed right above the integrated circuit 104, to prevent the integrated circuit 104 from damages caused by an external force during the wire bonding process, the insulating layer 116 disposed between the second bonding pads 108 and the integrated circuit 104 has a first thickness, which is substantially about 10 to 16 μm and is preferably about 12 to 14 μm. Further, the second bonding pads 108 may have a second thickness, which is substantially about 2.8 to 4 μm and is preferably about 3.5 μm. Thus, the bonding between the first metal lines 142 and the second bonding pads 108 becomes less likely disengaged.

As shown in FIG. 7, after the first metal lines 142 are formed, an encapsulation adhesive 146 is formed to tightly encapsulate the chip 102, the passive component 138, the first metal lines 142 and the second metal lines 144 on the upper surface of the carrier board 120, thereby forming the chip packaging structure 100 according to the embodiment of the present invention. Thus, the encapsulation adhesive 146 may protect the chip 102, the passive component 138, the first metal lines 142 and the second metal lines 144 from damages caused by collisions from an external object or external impacts. For example but not limited to, the encapsulation adhesive 146 may be formed by a transfer molding process or an adhesive dripping process, and the material of the encapsulation adhesive may be an epoxy molding compound material or a liquid encapsulant material. One person skilled in the art can easily understand that, the method for forming the encapsulation adhesive 146 of the present invention may adopt other sealing processes according to actual requirements, and the material of the encapsulation adhesive 146 may also vary for different sealing processes.

It should be noted that, in the chip packaging structure of the embodiment, the passive component is disposed at a region right above the integrated circuit, and may be electrically connected to the integrated circuit through the first bonding pads, the second bonding pads and the connecting pads formed by the same conductive layer, and the first metal lines. Compared to the prior art, the first metal lines of the embodiment only need to connect the first bonding pads and the second bonding pads located on the same plane, and the length of the first metal lines may be smaller than one half of the width of the chip. Thus, the chip packaging structure of the embodiment is capable of reducing the resistance/capacitance load effect of the lines, thereby reducing the power consumption of the integrated circuit and noise and enhancing the operational efficiency and speed of the integrated circuit.

The chip packaging structure and the manufacturing method of the chip packaging structure of the present invention are not limited to the above embodiments. Other embodiments and variations of the present invention are further disclosed below. To keep the illustration simple and to emphasize differences among the embodiments and variations, in the description below, the same denotations represent the same elements, and the repeated parts are omitted.

Figure 8:
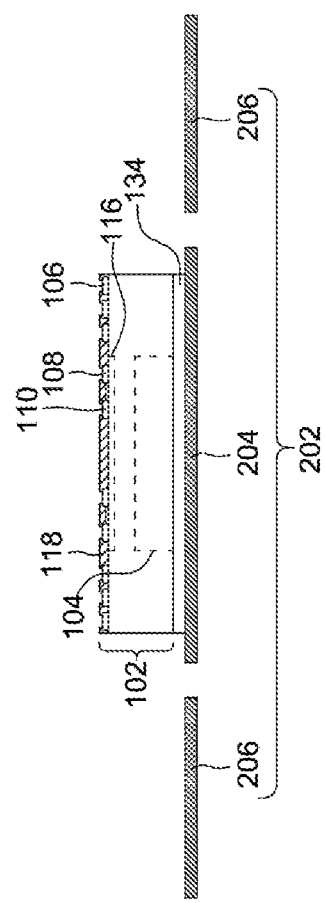
FIG. 8 and FIG. 9 are schematic diagrams of a manufacturing method of a chip packaging structure according to a second embodiment of the present invention.
Figure 9:
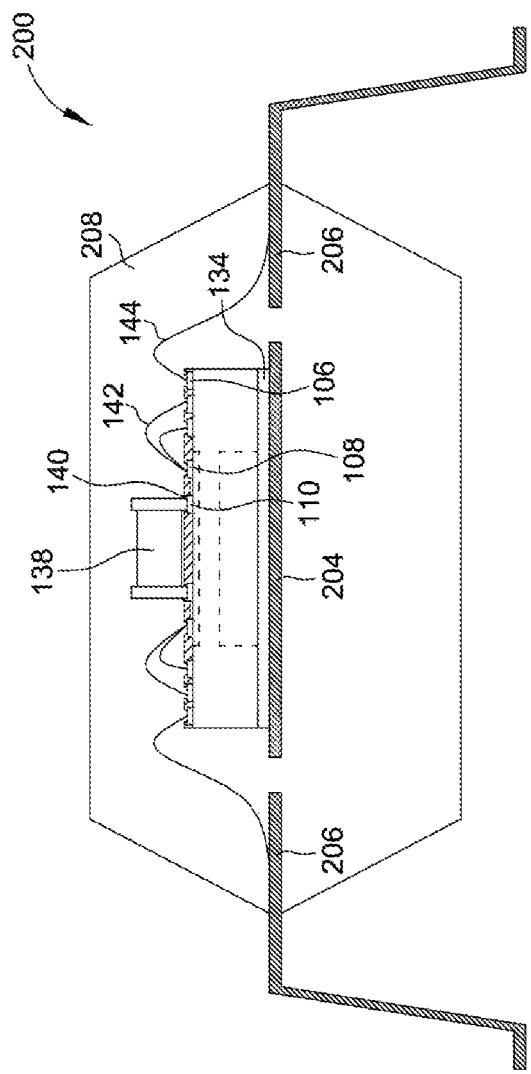

FIG. 8 and FIG. 9 are schematic diagrams of a manufacturing method of a chip packaging structure according to a second embodiment of the present invention. FIG. 9 shows a sectional view of a chip packaging structure according to the second embodiment of the present invention. As shown in FIG. 8, a carrier board 202 of a chip packaging structure 200 of the embodiment is different from the first embodiment. More specifically, the carrier board 202 includes a chip carrying frame 204 and a plurality of pins 206. Thus, in the embodiment, the step of mounting the chip 102 on the carrier board 202 is disposing the chip 102 on the chip carrying frame 204. In the embodiment, the carrier board 202 is a lead frame, and may be formed by a metal material. Further, the chip carrying frame 204 is separated from the pins 206 and is also electrically insulated from the pins 206. Details of the chip 102 of the embodiment are identical to those of the first embodiment, and shall be omitted herein. As shown in FIG. 9, a passive component 138 is mounted on the chip 102, and the first metal lines 142 and the second metal lines 144 are formed. In the embodiment, one end of each of the second metal lines is connected to at least one of the pins, and the other end is connected to one of the first bonding pads 106. Next, an encapsulation adhesive 208 is formed, and the chip 102, the passive component 138, the first metal lines 142, the second metal lines 144, the chip carrying frame 204 and a part of the pins 206 are encapsulated in the encapsulation adhesive 208. In the embodiment, details for disposing the passive component 138, forming the first metal lines 142 and the second metal lines 144, and forming the encapsulation adhesive 208 are identical to those of the first embodiment, and shall be omitted herein. In the embodiment, after the encapsulation adhesive 208 is formed, the pins 206 may be trimmed or bent to form a desired shape for the pins 206.

In conclusion, in the chip packaging structure of the present invention, the passive component is disposed at a region right above the integrated circuit, and may be electrically connected to the integrated circuit through the first bonding pads, the second bonding pads and the connecting pads formed by the same conductive layer, and the first metal lines. Compared to the prior art, the chip packaging structure of the present invention effectively reduces the resistance/capacitance load effect of the lines, thereby reducing the power consumption of the integrated circuit and noise as well as enhancing the operational efficiency and speed of the integrated circuit.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chip packaging structure, comprising:
   a chip, comprising an integrated circuit, a plurality of first bonding pads, at least two second bonding pads, and at least two connecting pads, the first bonding pads, the at least two second bonding pads and the at least two connecting pads being disposed above the integrated circuit, the at least two second bonding pads and the at least two connecting pads being separated from the integrated circuit, wherein, the at least two second bonding pads are respectively electrically connected to one of the at least two connecting pads;
   at least one passive component, disposed on the chip, comprising two electrodes respectively electrically connected to and adhered to one of the at least two connecting pads; and
   at least two first metal lines, disposed on the chip, each of the at least two first metal lines having one end electrically connected to one of the at least two second bonding pads, and one other end connected to one of the first bonding pads.

2. The chip packaging structure according to claim 1, wherein the chip further comprises at least two connecting lines, and the two connecting lines are respectively disposed between one of the second bonding pads and the corresponding one of the at least two connecting pads, to electrically connect the one of the second bonding pads and the corresponding one of the at least two connecting pads.

3. The chip packaging structure according to claim 2, wherein the at least two second bonding pads, the at least two connecting pads and the at least two connecting lines are formed by a same conductive layer.

4. The chip packaging structure according to claim 2, wherein the chip further comprises a protecting layer, the protecting layer is disposed on the integrated circuit and the at least two connecting lines, and comprises a plurality of first openings, two second openings and two third openings, the first openings respectively reveal one of the first bonding pads, the second openings respectively reveal one of the at least two second bonding pads, and the third openings respectively reveal one of the at least two corresponding connecting pads.

5. The chip packaging structure according to claim 1, wherein the chip further comprises an insulating layer, which is disposed between the integrated circuit and the at least two second bonding pads to separate the integrated circuit from the at least two second bonding pads.

6. The chip packaging structure according to claim 5, wherein the insulating layer has a first thickness that is substantially 10 to 16 μm.

7. The chip packaging structure according to claim 1, wherein each of the second bonding pads has a second thickness that is substantially 2.8 to 4 μm.

8. The chip packaging structure according to claim 1, further comprising two conductive adhesive layers, which adhere one of the electrodes onto the corresponding one of the at least two corresponding connecting pads, respectively.

9. The chip packaging structure according to claim 1, further comprising a carrier board and an encapsulation adhesive, wherein the chip is disposed on the carrier board and the encapsulation adhesive encapsulates the chip and the at least two first metals on the carrier board.

10. The chip packaging structure according to claim 9, further comprising a plurality of second metal lines, which are respectively connected between an upper surface of the carrier board and one of the corresponding first bonding pads.

11. The chip packaging structure according to claim 10, wherein the carrier board comprises a substrate, a plurality of upper bonding pads and a plurality of lower bonding pads, the upper bonding pads are disposed on an upper surface of the substrate, and the lower bonding pads are disposed on a lower surface of the substrate, the upper bonding pads are respectively electrically connected to at least one of the lower bonding pads, and one end of each of the second metal lines is connected to one of the upper bonding pads.

12. The chip packaging structure according to claim 10, wherein the carrier board comprises a chip carrying frame and a plurality of pins, the chip is disposed on the chip carrying frame, and one end of each of the second metal lines is connected to one of the pins.

13. A manufacturing method of a chip packaging structure, comprising:
   providing a chip, the chip comprising an integrated circuit, a plurality of first bonding pads, at least two second bonding pads, and at least two connecting pads, the first bonding pads, the at least two second bonding pads and the at least two connecting pads being disposed above the integrated circuit, the at least two second bonding pads and the at least two connecting pads being separated from the integrated circuit, wherein, the at least two second bonding pads are respectively electrically connected to one of the at least two connecting pads;
   mounting the chip on a carrier board;
   mounting at least one passive component on the chip, the at least one passive component comprising two electrodes, which are respectively electrically connected to and adhered to one of the at least two connecting pads; and
   forming at least two first metal lines on the chip, to cause each of the at least two metal lines to have one end electrically connected to one of the at least two second bonding pads, and one other end connected to one of the first bonding pads.

14. The manufacturing method of a chip packaging structure according to claim 13, wherein the step of forming the at least two first metal lines is performed by a wire bonding process.

15. The manufacturing method of a chip packaging structure according to claim 13, after forming the at least two first metal lines, further comprising forming an encapsulation adhesive to encapsulate the chip, the at least one passive component and the at least two first metal lines on an upper surface of the carrier board.

16. The manufacturing method of a chip packaging structure according to claim 13, wherein the chip further comprises at least two connecting lines, and the two connecting lines are respectively disposed between one of the second bonding pads and the corresponding one of the at least two corresponding connecting pads, to respectively electrically connect the one of the second bonding pads and the corresponding one of the at least two corresponding connecting pads.

17. The manufacturing method of a chip packaging structure according to claim 16, wherein the at least two second bonding pads, the at least two connecting pads and the at least two connecting lines are formed by a same conductive layer.

18. The manufacturing method of a chip packaging structure according to claim 16, wherein the chip further comprises a protecting layer, the protecting layer is disposed on the integrated circuit and the at least two connecting lines, and comprises a plurality of first openings, two second openings and two third openings, the first openings respectively reveal one of the first bonding pads, the second openings respectively reveal one of the at least two corresponding second bonding pads, and the third openings respectively reveal one of the at least two corresponding connecting pads.

19. The manufacturing method of a chip packaging structure according to claim 13, wherein the chip further comprises an insulating layer, which is disposed between the integrated circuit and the at least two second bonding pads to separate the integrated circuit from the at least two second bonding pads.

20. The manufacturing method of a chip packaging structure according to claim 19, wherein the insulating layer has a first thickness that is substantially 10 to 16 μm.

21. The manufacturing method of a chip packaging structure according to claim 13, wherein each of the second bonding pads has a second thickness that is substantially 2.8 to 4 μm.

22. The manufacturing method of a chip packaging structure according to claim 13, wherein the step of forming the at least two first metal lines further comprises forming a plurality of second metal lines such that the second metal lines are connected between an upper surface of the carrier board and the first bonding pads.

23. The manufacturing method of a chip packaging structure according to claim 22, wherein the carrier board comprises a substrate, a plurality of upper bonding pads and a plurality of lower bonding pads, the upper bonding pads are disposed on an upper surface of the substrate, and the lower bonding pads are disposed on a lower surface of the substrate, the upper bonding pads are respectively electrically connected to at least one of the lower bonding pads, and one end of each of the second metal lines is connected to one of the upper bonding pads.

24. The manufacturing method of a chip packaging structure according to claim 22, wherein the carrier board comprises a chip carrying frame and a plurality of pins, the chip is disposed on the chip carrying frame, and one end of each of the second metal lines is connected to one of the pins.

\* \* \* \* \*